United States Patent [19]
Miller

[11] 4,356,395
[45] Oct. 26, 1982

[54] DIGITAL FIBER OPTIC SENSOR SYSTEM

[75] Inventor: Glen E. Miller, Redondo, Wash.

[73] Assignee: The Boeing Company, Seattle, Wash.

[21] Appl. No.: 55,438

[22] Filed: Jul. 6, 1979

[51] Int. Cl.$^3$ .................... G02B 5/14; H03K 13/02
[52] U.S. Cl. .............................. 250/227; 340/347 M; 340/347 P; 340/347 AD; 350/96.1
[58] Field of Search .............. 350/96.1, 96.13, 96.16; 250/227; 340/347 M, 347 P

[56] References Cited

U.S. PATENT DOCUMENTS

| | | | |
|---|---|---|---|
| 3,892,468 | 7/1975 | Duguay | 250/227 X |
| 3,925,727 | 12/1975 | Duguay | 250/227 X |
| 4,092,059 | 5/1978 | Hawkes et al. | 350/96.16 |
| 4,117,460 | 9/1978 | Walworth et al. | 250/227 X |
| 4,166,946 | 9/1979 | Chown et al. | 350/96.16 X |

OTHER PUBLICATIONS

The Engineering Staff of Analog Devices, Inc., Analog-Digital Conversion Handbook, 6/72, pp. I-8; II-44, 45, 80 & 81.
Callahan, Optical Delay Line Compressor, IBM Technical Disclosure Bulletin, vol. 14, No. 8, 12/71, pp. 2208, 2209.
American Optical Company, Fast, Quiet, Reliable Fiber-Optic, "Readers", 7/68, 1 page.

*Primary Examiner*—T. J. Sloyan
*Attorney, Agent, or Firm*—Thomas H. Murray

[57] ABSTRACT

A digital fiber optic sensor system utilizing a conventional n-track encoder system, but wherein the number of fiber optic paths to and from the sensor is reduced to one or two by utilizing the delay properties of optical fibers. These properties make it possible to divide a single short-duration optical pulse among several optical fibers of differing lengths to produce, at the far ends of the fibers, a like number of short-duration optical pulses essentially identical in shape and amplitude but spaced in time. Each of these fibers can be used to illuminate a different track of a multi-track optical encoder such that the tracks become sequentially interrogated by the time-spaced pulses. When the time-spaced responses are recombined, they form a serial binary word. In effect, a form of time-division multiplexing is achieved with the use of a minimum number of optical fiber elements.

9 Claims, 11 Drawing Figures

DIGITAL FIBER OPTIC SENSOR SYSTEM

BACKGROUND OF THE INVENTION

As is known, optical encoders have been provided in the past in which the position of a linearly-movable or rotary element, for example, is determined by optically interrogating an encoder on the element which has a number of parallel coded tracks, each of which represents a specific bit of a binary word. For each position of the element, the tracks will present to optical interrogators a different binary word. Thus, from the binary word detected by the optical interrogators, the position of a movable element, liquid level or the like can be determined.

In the past, optical encoders of this type have usually required the use of separate fiber optic paths and separate emitters for interrogating each track of the encoder. This means that for an n-track encoder, for example, a minimum of n+2 electrical conductors are required—one for the illuminator and for each detector, plus one common conductor. A 12-bit encoder thus requires a minimum of fourteen conductors. Aside from the large number of conductors required in prior art systems of this type, component failures can result in large undetectable measurement errors. For example, failure of the illuminator reduces the output to an all-zero pattern. Failure of a single detector, the conductor to that detector, or any of the associated connector pins, reduces the corresponding bit to a zero state, thereby introducing an error proportional to the significance of that bit. If failure occurs in the most significant bit, for instance, the error can be as large as 50%. Most importantly, conventional prior art methods for optical encoding provide no means for detecting the occurrence of such failures unless redundant sensors and a voting scheme are used, thereby further complicating the system and increasing the number of conductors required.

Instead of using discrete electrical detectors for encoders of the type described above and their associated electrical conductors, it is also possible to utilize fiber optic circuits. Such an arrangement, for example, is shown in U.S. Pat. No. 4,117,460 issued to Walworth et al. Fiber optic systems of this type have numerous advantages among which are resistance to gamma and neutron radiation, resistance to temperature extremes, resistance to corrosive atmospheres, and safety in inflammable and explosive atmospheres. The highfidelity delay line characteristics of optical fibers has also been recognized as exemplified in U.S. Pat. Nos. 3,925,727 and 3,958,229 to Duguay. However, no prior art system is known relating to the use of optical fibers specifically for sensors which can be used for the measurement of mechanical displacement, liquid level or other physical parameters.

SUMMARY OF THE INVENTION

In perhaps its broadest aspects, the present invention resides in the provision of means for converting a single light pulse into a serial train of pulses of uniform amplitude with the use of optical fibers of differing lengths which can transmit the single light pulse and receive a reflected train of pulses through a single optical fiber.

More specifically, and in accordance with the present invention, an optical encoder is provided wherein the delay characteristics of optical fibers are employed to achieve a system wherein only one light emitter is required and wherein as little as one fiber optic path can be used to transmit time-multiplexed light pulses to and from an encoder. This results in higher reliability, reduced weight, reduced volume, and reduced cost of the fiber optics and fiber optic connectors. Furthermore, with the use of a single fiber optic path, all data bits share the same components which can be subject to degradation. These components include the emitter, the transmission path fiber optics, the detector and the receiver. As a result, all received data bits are of essentially the same amplitude, meaning that positive indication of sensor failure can be easily detected.

The invention also permits the inclusion of one or more additional bits which are present in all possible data words and which can be used for word synchronization, sensor identification and automatic adjustment of the receiving circuitry gain to compensate for signal strength variations. This is in contrast to the prior art systems where it is possible for very large errors to result from failure of one or more bits caused by failure of components unique to those bits.

In a specific embodiment of the invention shown herein, a sensor receives a sequence of single short-duration optical interrogation pulses via a single fiber optic path. In response to each single interrogation pulse, the sensor responds by producing an output consisting of a series of optical pulses which form a serial binary word in which the state of the individual bits correspond, bit-for-bit, with the state of the bits imprinted on an encoder. The encoder may be linear in nature for sensing linear displacements or may be circular in nature for sensing angular displacement. As is conventional, the encoder has a number of parallel coded tracks, each corresponding to a specific bit of a binary word and each track consisting either of alternately reflective and absorptive areas for reflective encoding or alternately transmissive and non-transmissive areas for transmissive encoding. An electronic unit generates the optical interrogation pulses and receives the optical response pulses and converts them into an equivalent electrical output which may be either serial binary or parallel binary. Either a single fiber optic path can be used for both interrogation and response in a reflective encoder arrangment or two fiber optic paths can be employed for a transmissive encoder, one for interrogation and a second for response pulses.

The above and other objects and features of the invention will become apparent from the following detailed description taken in connection with the accompanying drawings which form a part of this specification, and in which:

Figure 1A:
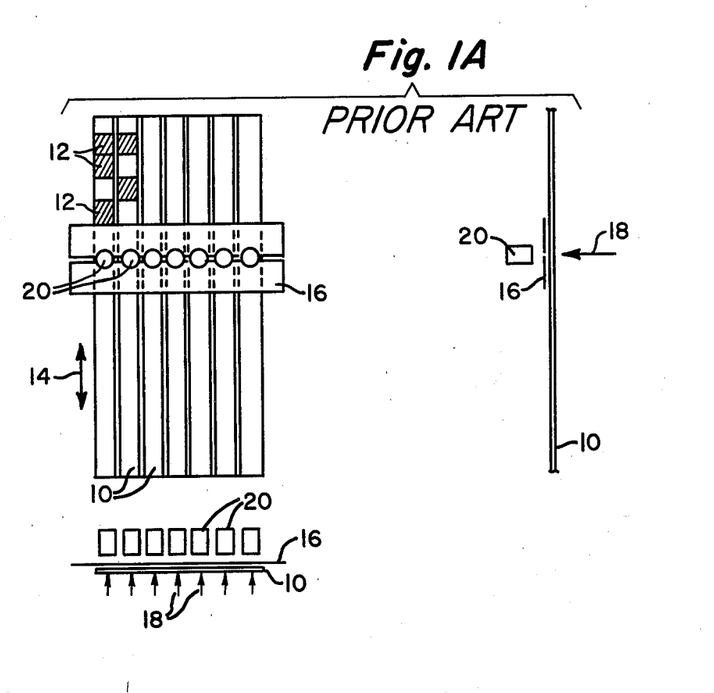
FIG. 1A illustrates the principle of a transmissive encoder.

With reference now to the drawings, and particularly to FIG. 1A, there is shown a conventional n-track encoder of the transmissive type which can be employed in practicing the invention. It comprises several encoding tracks 10 which are positioned on a movable element, not shown, whose position is to be determined. Since the tracks are straight in FIGS. 1A and 1B, the element of which they are positioned will be subject to linear movement. In the direction of motion, each track has periodically-spaced areas 12 which are alternately transmissive and non-transmissive to light, the non-transmissive areas being shown in FIG. 1A as shaded. The pattern of transmissive and non-transmissive areas is such that, when in a line normal to the direction of motion indicated by the arrow 14, the transmissive areas present a binary code which uniquely defines the position of the encoder relative to that line.

As shown in FIG. 1A, the method for reading such a code optically, and for producing equivalent electrical outputs, is to locate a stationary slit 16 normal to the direction of encoder motion and to locate a suitable light source on the opposite side of the encoder, the illumination being indicated by the arrow 18 in FIG. 1A. Photodetectors 20, one for each track 10, are located on the side of the slit opposite the ilumination indicated by the arrow 18 along a line extending perpendicular to the direction of motion 14. As will be appreciated, light passing through the transmissive areas of the encoder and through the slit 16 causes the array of detectors 20 to respond either photoconductively or photovoltaically to produce electric outputs corresponding to the binary code for that position of the encoder.

Figure 1B:
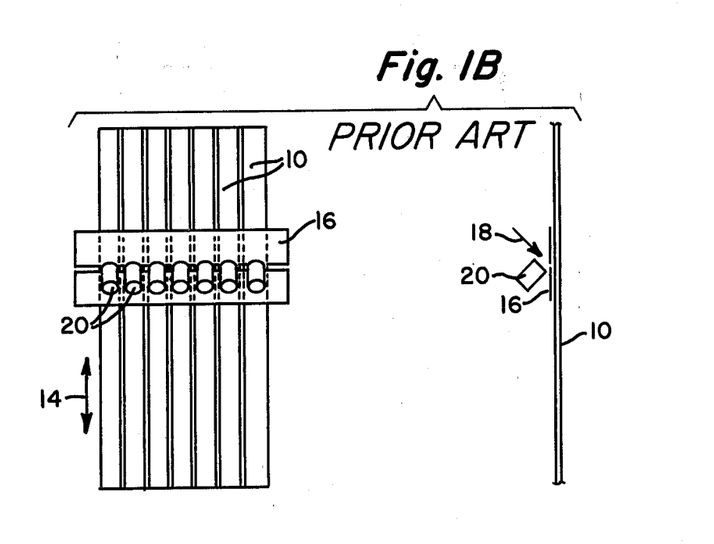
FIG. 1B represents the principle of a reflective encoder.

The reflective system illustrated in FIG. 1B is similar to that of FIG. 1A; and, accordingly, elements shown in FIG. 1B which correspond to those of FIG. 1A are identified by like reference numerals. In this case, however, the illumination and the detectors 20 are in the same side of the slit 16. Illumination indicated by the arrow 18, at an acute angle to the slit 16, passes through the slit and is reflected from the strips or tracks 10 back to the detectors 20. Depending upon whether a reflective or absorptive area is behind the slit 16, the output of the detector 20 will be at one level or another to indicate either a binary "0" or a binary "1" bit.

In the description given above, it is assumed that the detectors 20 comprise individual photodetectors. In the present invention, however, only a single photodetector need be employed as will be described hereinafter. The system of FIGS. 1A and 1B, of course, requires that for an n-track encoder, a minimum of n+2 electrical conductors are required, one for the illuminator and for each detector, plus one common conductor.

Figure 2:
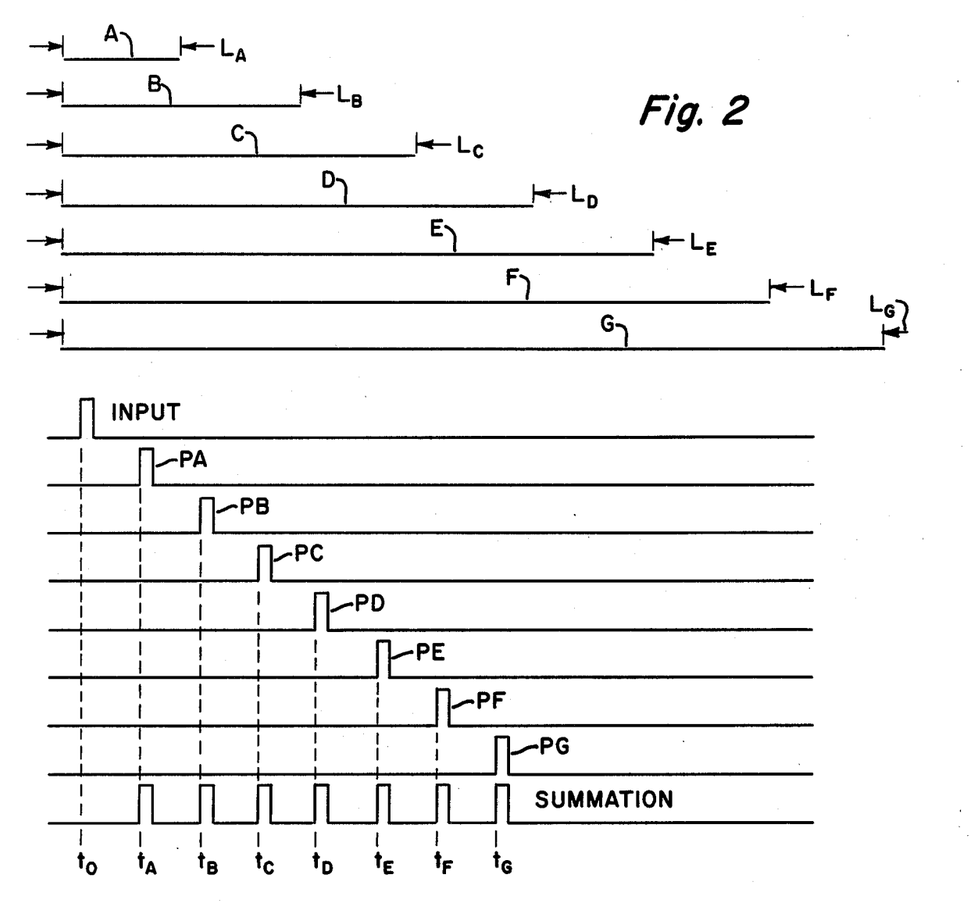
FIG. 2 illustrates the delay principle utilized in the present invention.

In FIG. 2, seven optical fibers identified by the letters A–G with differing lengths are shown. These should be low-loss, high-bandwidth communications fibers such as those manufactured by Corning Glass Works. Optical fibers of this type, notably the graded-index and single-mode types, make excellent delay lines for the following reasons: First, the delay is on the order of 5 nanoseconds per meter and the attenuation is typically less than 0.01 dB per meter. Both parameters are very stable with time and with variations in temperature. Secondly, low dispersion in these fibers permits the faithful transmission of pulses with rise and fall times significantly less than 1 nanosecond over distances of several hundreds of meters. These excellent properties make it possible to divide a single short-duration optical pulse among several optical fibers of differing lengths of produce, at the far ends of the fibers, a like number of short-duration optical pulses essentially identical in shape and amplitude but spaced in time. This is shown by the waveforms at the bottom of FIG. 2 wherein pulse PA appears at the right end of fiber A, pulse PB appears at the right end of fiber B, and so on. If each of the fibers shown in FIG. 2 is utilized to illuminate a different track of a multi-track optical encoder such as the tracks 10 shown in FIGS. 1A and 1B, then those tracks become sequentially interrogated by the time-spaced pulses. If the time-spaced responses are recombined, they then form a serial binary word. In effect, a form of time-division multiplexing is achieved.

Because fibers of the type described typically have a diameter less than 0.005 inch, very significant delays can be achieved in a relatively small volume. With careful design, it is possible to wind the fibers around the inside or outside of the sensor structure so that the dimensions of the structure are increased only slightly, if at all. Fibers so installed and suitably protected should remain highly stable and reliable because they are inaccessible and can be made virtually immune to environmental factors which might cause failure.

As shown in FIG. 2, fibers A–G have lengths $L_A$ through $L_G$, respectively, each successive length being longer than that of the preceding fiber. If light travels through an optical fiber with a velocity V, then the time required for an optical pulse to travel through a fiber of length L is equal to L/V. It follows that the time delay through each fiber A through G is $t_A = L_A/V$, $t_B = L_B/V$, $t_C = L_C/V$, and so on as shown in FIG. 2.

Figures 3, 4:
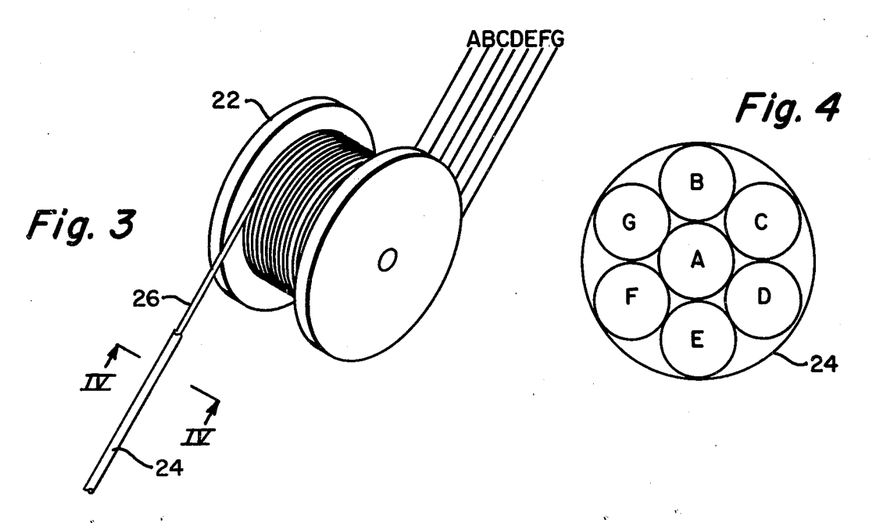
FIG. 3 illustrates a sensor delay unit which can be used in accordance with the invention wherein fibers of differing lengths are wound around a spool to provide a compact configuration.
FIG. 4 is a cross-sectional view taken substantially along line IV—IV of FIG. 3 showing the sensor optical interface between optical fibers of differing lengths and a single fiber optics element connected at its other end to an electronic unit.

FIG. 3 shows a sensor display unit composed of fibers A–G wound, for purposes of illustration, around a spool 22. In FIG. 3, the light output of a single large optical fiber 24 is uniformly divided between smaller diameter fibers A–G. The fibers A–G are bundled together at interface 26 as shown in FIG. 4 such that their aggregate cross section falls entirely within the cross section of the large diameter fiber 24. If the large diameter fiber 24 consists also of a bundle of smaller diameter fibers, it is then necessary to insert a short section of large-diameter fiber (i.e., a "mixing rod") at the interface to insure uniform power division.

Figure 5:
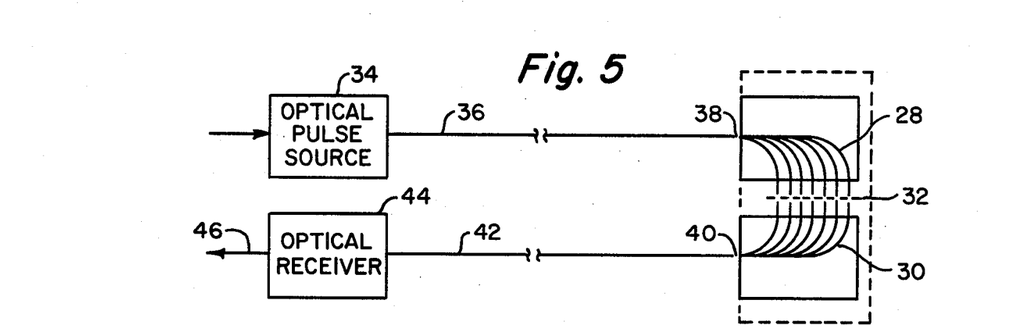
FIG. 5 illustrates one configuration of the sensor of the invention utilizing a transmissive encoder and employing two fiber optic elements for transmission and reception of light pulses.

FIG. 5 illustrates one configuration of the sensor of the invention using a transmissive encoder. The sensor consists of two delay units 28 and 30 comprised of fibers of differing lengths. The upper delay unit 28 illuminates a transmissive encoder 32 with time-multiplexed light pulses; while the lower delay unit 30 accepts the light which passes through the transmissive areas of encoder 32. In response to an electrical trigger input to an optical pulse source 34, a short-duration light pulse is produced which is coupled by large-diameter optical fiber 36 to optical interface 38 where it is divided between smaller-diameter optical fibers of differing lengths. The upper delay unit 28 thus produces a series of differentially-delayed optical pulses, one for each track of the encoder 32. The lower delay unit 30 accepts the optical pulses and introduces an additional differential delay between the pulses. The twice-differentially-delayed optical pulses then combine at interface 40 and are subsequently carried as a serial pulse train via large diameter optical fiber 42 to an optical receiver 44 where they are detected to produce an electrical serial pulse train output at lead 46. The presence or absence of the various pulses in the train output at lead 46 provides a coded binary word which uniquely defines the position of encoder 32 relative to the delay units 28 and 30. In the example given, the total differential delay of a given pulse is simply the sum of those delays contributed to it by the two delay units 28 and 30. The two delay units 28 and 30 need not contribute equal delays. The optical fibers 36 and 42 may comprise a single fiber or a bundle of fibers; however, as explained above, if bundles are used for the elements 36 and 42, mixer rods should be included at interfaces 38 and 40 to insure uniform distribution of power among the fibers.

Figure 6:
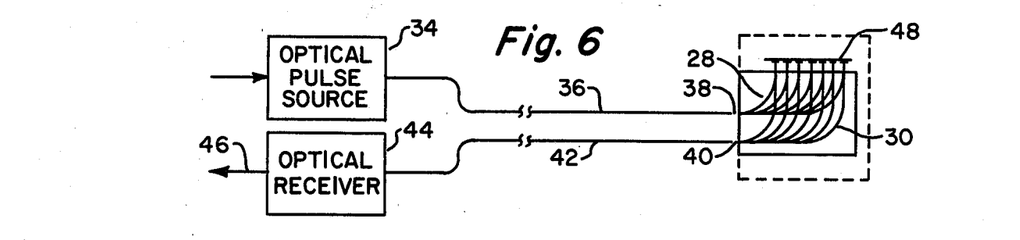
FIG. 6 illustrates another embodiment of the invention similar to that of FIG. 5 but wherein a reflective encoder is employed together with a single fiber optics element for both transmission and reception of light elements.

In FIG. 6, an embodiment of the invention is shown similar to that of FIG. 5 but using a reflective encoder 48. Other elements of FIG. 6 which correspond to those of FIG. 5 are identified by like reference numerals. In this case, the upper delay unit 28 illuminates the encoder 48 and the lower delay unit 30 accepts reflected light from the reflective areas of the encoder 48 in a manner similar to the arrangement shown in FIG. 1B. Aside from this, the operation of the system of FIG. 6 is identical to that of FIG. 5.

Figures 7, 8:
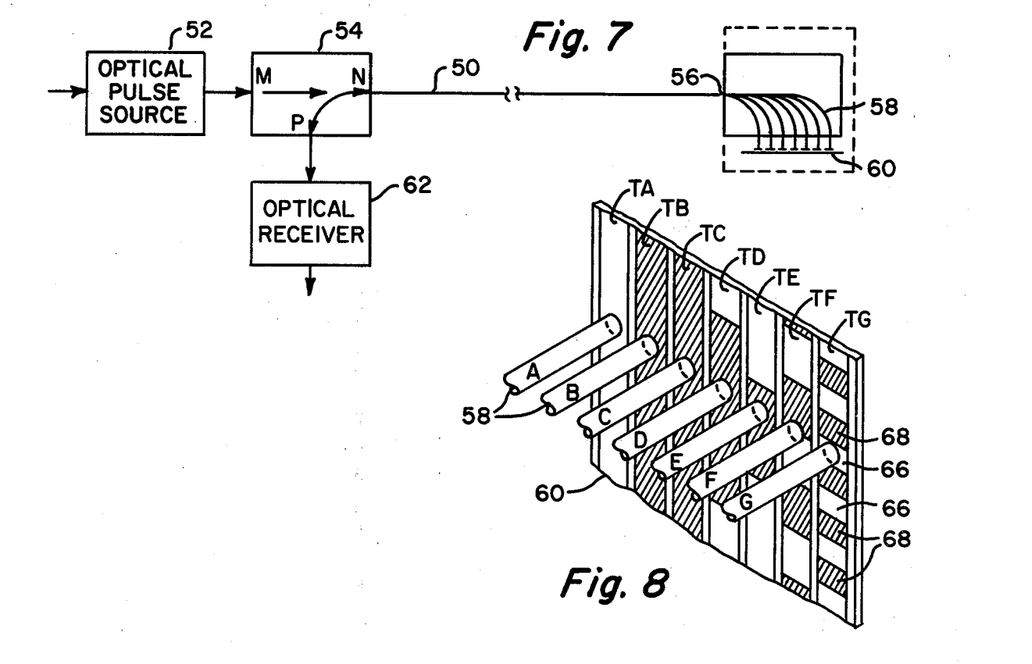
FIG. 7 illustrates an embodiment of the invention which utilizes a single fiber optics element and a directional coupler.
FIG. 8 shows the details of the encoder used in the embodiment of FIG. 7.

The embodiments of FIGS. 5 and 6 use one optical fiber (or a bundle of fibers) 36 for transmission to the sensor and a separate fiber 42 for transmission from the sensor. FIG. 7 illustrates a configuration of the invention in which a single fiber 50 performs both functions. A light pulse from optical pulse source 52 passes efficiently from port M to port N of directional coupler 54 with little or no coupling to port P. The optical pulse is coupled from port N through optical fiber 50 to optical interface 56 where it is divided between a single set of smaller diameter fibers 58 which terminate at a reflective encoder 60. The differentially-delayed pulses from the fibers 58 are reflected by reflective areas of the encoder 60 directly back into the fibers 58 where they are delayed a second time, are combined at the interface 56 in serial fashion, and returned to port N of directional coupler 54. Pulses entering port N are coupled efficiently to port P of the coupler 54 and then into an optical receiver 62 adapted to produce a serial output pulse train which defines a binary word. In addition to providing operation with only a single optical fiber 50 for both transmission and reception, the configuration of FIG. 7 offers the advantage of requiring only half the length of fiber in the delay unit to achieve a given differential delay.

FIG. 8 shows details of a typical encoder used in the embodiment of FIG. 7. Shown is a 7-track reflective encoder 60 on which the position code is in the form of alternately reflective areas 66 and absorptive areas 68. Tracks TB through TG are data tracks, track TB encoding the most significant bit and track TG encoding the least significant bit. Pulses are reflected back into the fibers A-G whenever those fibers see a reflective area on the corresponding track. Depending upon the position of the encoder, any, all or no pulses may be reflected back into the fibers A-G.

Sync track A on the encoder 60 is reflective for all positions of the encoder such that pulses are directed onto track TA in all positions. The reflected pulse from track TA will be reflected back into fiber A and serves the following functions: First, it is used to automatically adjust the receiver electronic sensitivity, thereby permitting the system to operate in an optimum manner even though the transmission path loss, interrogation pulse amplitude and detector sensitivity may vary with time, temperature and other causes. Secondly, since the fiber directed onto track TA is the shortest fiber in the bundle, it is always the first pulse of the binary-coded word received by the receiver and can, therefore, be used for synchronization purposes. Thirdly, the presence or absence of a pulse reflected from track TA can be taken as a highly reliable indication of sensor normal or abnormal operation. Except for a different path through the delay unit, the path for the pulse from track TA is identical to the path for pulses from tracks TB through TG. It is, therefore, highly improbable that any pulse from tracks TB-TG can fail without the pulse from track TA also failing. Finally, if several of the delay unit fibers interface with track TA, or with additional tracks of the same type, the binary response word from the sensor can always be made to contain a uniquely-coded group of bits which may be used also for sensor identification. This principle can be of value in data-bus applications where the responses from several sensors might appear on the same bus.

Figure 9:
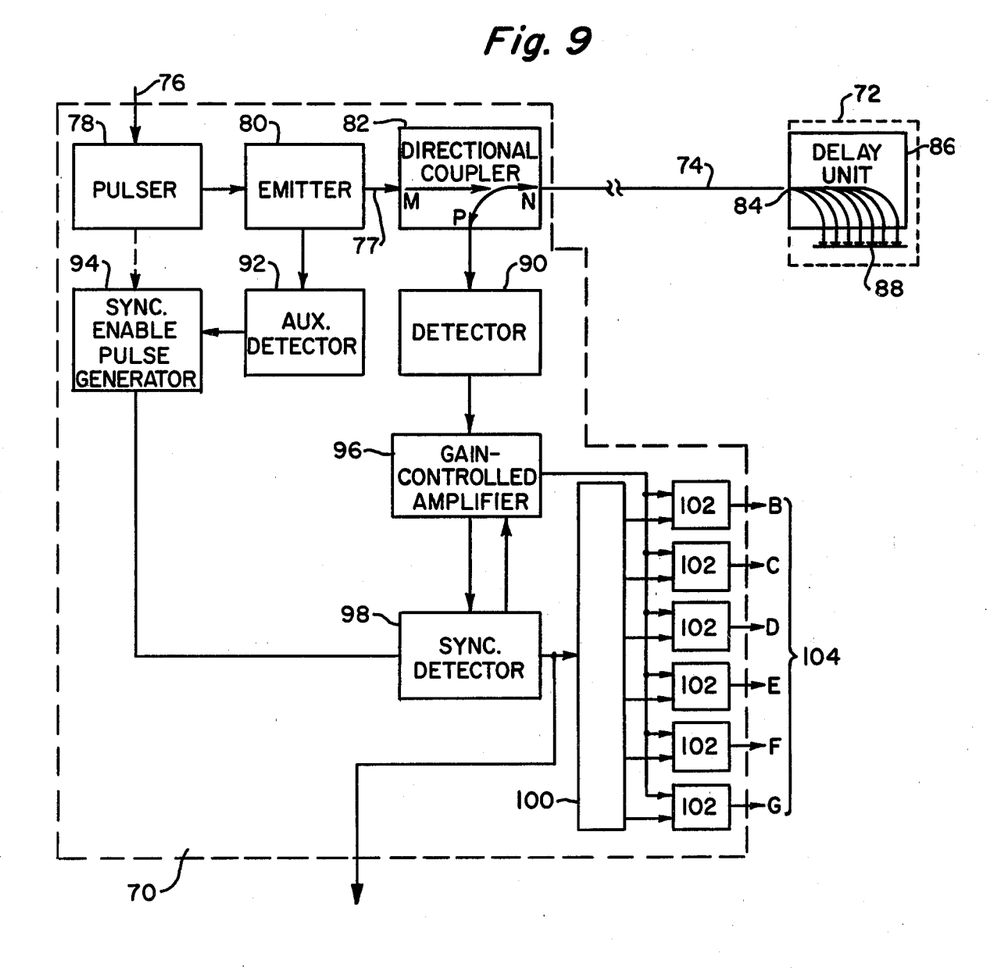
FIG. 9 is a schematic block diagram of a complete sensor system utilizing the reflective encoder of FIG. 8.
Figure 10:
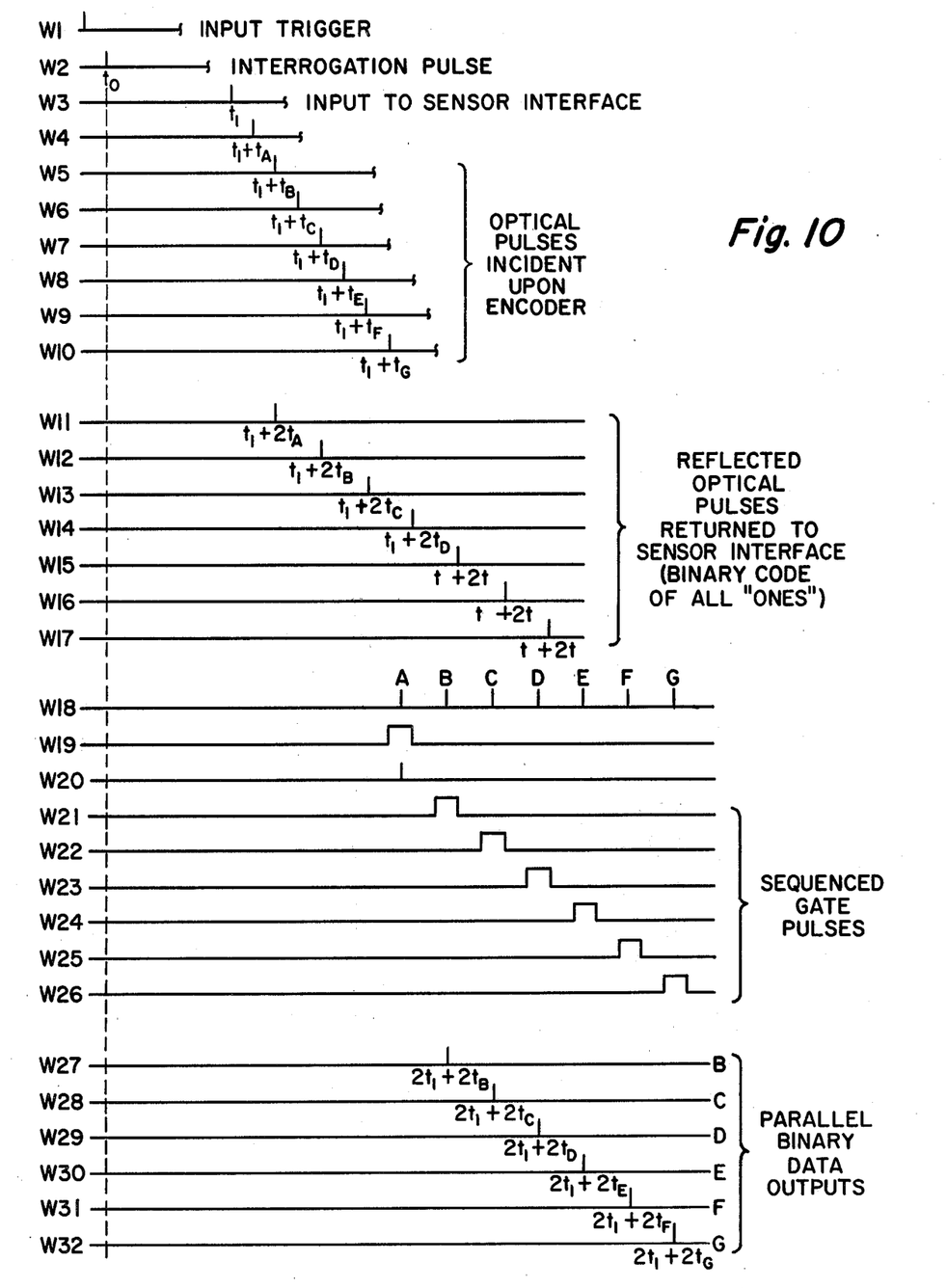
FIG. 10 comprises waveforms illustrating the operation of the system of FIG. 9.

FIG. 9 is a schematic block diagram of a complete sensor system using the reflective encoder of FIG. 8 and FIG. 10 comprises waveforms illustrating the operation of the circuitry of FIG. 9. The sensor system shown in FIG. 9 comprises three major components: an electronics unit 70, a sensor 72 and a fiber optics path 74.

An electrical trigger input pulse on lead 76 causes pulser 78 to produce a short-duration electrical pulse (waveform W1, FIG. 10) which drives emitter 80 into conduction, causing it to produce a short-duration optical interrogation pulse 77 shown as waveform W2 in FIG. 10. The emitter 80 may comprise a high-speed light-emitting diode, a laser or an injection laser diode. The optical interrogation pulse 77 shown in FIG. 10 typically has a peak pulse power output between 1 milliwatt and several watts. The duration of the optical interrogation pulse 77 is typically between a few picoseconds and a few nanoseconds. The optical interrogation pulse 77 passes efficiently through directional coupler 82 shown in FIG. 9 from port M to port N with little or no power passing to port P. The optical interrogation pulse emerges from port N of the directional coupler 82 and is coupled by fiber optics path 74 and interface 84 into a delay unit 86 which, as previously described, comprises a series of optical fibers of different lengths which produce a series of differentially-delayed optical pulses, one pulse for each track of an encoder 88. Waveforms W1 through W10 of FIG. 10 show the timing relationships between the input trigger pulse, interrogation pulse 77, and the pulses which emerge from the far ends of fibers A through G of delay unit 86. Time delay $t_1$ shown in FIG. 10 is the time delay through the fiber optics path 74.

Optical pulses emerging from each fiber of delay unit 86, and incident upon the corresponding tracks of encoder 88, are either absorbed or reflected, depending upon the position of the encoder. The pulses reflected from the encoder 88 return through the corresponding fibers of the delay unit 86 and combine at optical interface 84 to return as a serial pulse train to the electronics unit 70 through fiber optics path 74. The timing of the reflected pulses at interface 84 is shown by waveforms W11 through W17 of FIG. 10. The timing of the reflected, serial pulses returned through directional coupler 82 to detector 90 is shown by waveform W18 of FIG. 10. Waveform W18 of FIG. 10 is also representative of the electrical output of detector 90. Waveform W18 shows seven pulses, one from each of the six encoder tracks TB-TG and one from track TA. The pulse from track TA is always present since, as is explained above, track TA is reflective throughout its length.

Reverting again to FIG. 9, conversion of the pulse train output of detector 90 into conventional binary output may be accomplished as follows: The interrogation pulse 77 is sampled within the electronics unit 70 by auxiliary detectors 92 or by sampling the electrical pulse output of pulser 78. This sample of the interrogation pulse triggers sync enable pulse generator 94 which generates a pulse coincident in time with the pulse from track TA at the output of gain-controlled amplifier 96. The timing relationships are shown by waveforms W18, W19 and W20 of FIG. 10. The amplitude of the pulse from track TA is detected by sync detector 98 and is used to control the gain the amplifier 96 to maintain the detected sync pulse at a substantially constant amplitude. The detected sync pulse also triggers sequencing gate generator 100 which produces gating pulses coincident in time with the pulses from tracks TB through TG at the output of amplifier 90. The gating pulses are fed into the corresponding coincident gates 102 which switch the corresponding data pulses into the appropriate output lines 104 as parallel binary data where the short-duration pulses can be converted by means of flip-flops, for example, into conventional binary logic signals. The timing relationships of the gate pulses and the parallel data outputs are shown by waveforms W21 through W32 of FIG. 10. The detected sync pulse appearing on lead 106 may be used in appropriate circuitry, as previously discussed, to verify proper performance of the system.

The coincidence gates 102 of FIG. 9 can be replaced with photoconductive diodes or photoconductive transistors, and the sequencing gate generator 100 with a delay unit similar to unit 86, the input to the latter delay unit being derived from a suitably delayed sample of the optical interrogation pulse 77.

Although the invention has been shown in connection with certain specific embodiments, it will be readily apparent to those skilled in the art that various changes in form and arrangement of parts may be made to suit requirements without departing from the spirit and scope of the invention. In this respect, it will be apparent that the concept applies equally well to angular position sensors using circular encoders. The invention also applies to sensors where the parameters sensed can be first converted into a mechanical motion which can be encoded by the apparatus described herein. Devices, such as bimetallic stripes, diaphragms or bellows for temperature and pressure sensors lend themselves readily to the invention. The concept also applies to sensors of parameters such as liquid level, in which an incident optical pulse can be either absorbed or reflected, or transmitted or not transmitted, as a function of the parameter, the value of which is being encoded. The term "light-transmitting areas", as used in the following claims, means either a reflective area of an encoder or other surface or an open area through which light passes.

I claim as my invention:

1. Apparatus for converting a single optical pulse into a serial train of time-multiplexed pulses of essentially uniform amplitude and shape, comprising means for simultaneously directing a single light pulse onto the ends of optical fibers such that each fiber receives the same amount of light, the fibers being of different lengths whereby the pulses emanating from all of the opposite ends of the fibers will be delayed one with respect to the other, said pulses emanating from the opposite ends of the fibers being directed onto reflective surfaces and being thereafter reflected back through the optical fibers of different lengths to a single optical fiber where they pass through said single fiber as a serial train of pulses.

2. Apparatus for converting a single optical pulse into a serial train of pulses defining a binary word, comprising means for directing a light pulse onto optical fibers of different lengths whereby the pulses emanating from the opposite ends of the fibers will be delayed one with respect to the other, means for directing the delayed pulses emanating from said opposite ends onto light-reflecting or light-absorbing areas, one area of which defines one bit in a binary word, and the other of which defines another bit in a binary word, and means including optical fiber means for combining only the reflected pulses into a serial train of pulses which define a binary word, the pulses reflected from said reflective areas being transmitted back through said optical fibers of different lengths to said means for combining.

3. The apparatus of claim 2 wherein said means for combining reflected pulses into a serial train of pulses comprises a single optical fiber element of diameter larger than the diameters of the fibers of different lengths, and wherein reflected pulses are directed from said fibers of different lengths onto said single optical fiber.

4. The apparatus of claim 2 wherein said light-reflecting or light-absorbing areas are disposed on an encoder along a path extending substantially perpendicular to the direction of movement of an element on which the encoder is positioned, there being a plurality of lines of light-reflecting or light-absorbing areas extending parallel to each other and perpendicular to the direction of movement of said element whereby the position of the element can be determined from the serial train of pulses derived from any line of light-reflecting or light-absorbing areas.

5. The apparatus of claim 2 including electrical circuitry for converting electrical pulses corresponding to said serial train of pulses which define a binary word into parallel binary outputs which define the same word.

6. The apparatus of claim 5 including means for producing a synchronizing pulse at the beginning of each serial train of pulses, said circuitry for converting said serial train of pulses into parallel binary outputs being triggered by said synchronizing pulse.

7. The apparatus of claim 3 wherein said single optical pulse is transmitted through said single optical fiber onto the ends of said optical fibers of different lengths.

8. The apparatus of claim 7 wherein said single optical pulse is coupled to said single optical fiber through a directional coupler which will direct said single pulse from one port to a second port but which will direct reflected pulses from said second port to a third port.

9. The apparatus of claim 8 including means coupled to said third port for converting reflected pulses into a train of corresponding electrical pulses.

* * * * *